United States Patent
Jensen et al.

(10) Patent No.: US 6,315,634 B1
(45) Date of Patent: Nov. 13, 2001

(54) METHOD OF OPTIMIZING CHEMICAL MECHANICAL PLANARIZATION PROCESS

(75) Inventors: Alan John Jensen, White Salmon, WA (US); Cangshan Xu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/680,589

(22) Filed: Oct. 6, 2000

(51) Int. Cl.⁷ .................................................. B24B 49/00
(52) U.S. Cl. ................................ 451/5; 451/10; 451/41; 451/59
(58) Field of Search .......................... 451/5, 9, 10, 11, 451/41, 59

(56) References Cited

U.S. PATENT DOCUMENTS

| | | |
|---|---|---|
| 5,722,875 * | 3/1998 | Iwashita et al. ........................ 451/8 |
| 5,913,712 * | 6/1999 | Molinar ................................ 451/41 |
| 5,916,012 | 6/1999 | Pant et al. . |
| 5,951,380 * | 9/1999 | Kim ....................................... 451/65 |
| 6,015,333 * | 1/2000 | Obeng .................................... 451/8 |
| 6,168,508 * | 1/2001 | Nagahara et al. .................... 451/527 |
| 6,217,412 * | 4/2001 | Campbell et al. ..................... 451/8 |
| 6,218,306 * | 4/2001 | Fishkin et al. ....................... 438/692 |
| 6,224,460 * | 5/2001 | Dunton et al. ......................... 451/6 |
| 6,248,006 * | 6/2001 | Mukhopadhyay et al. ............ 451/57 |

* cited by examiner

*Primary Examiner*—Eileen P. Morgan
(74) *Attorney, Agent, or Firm*—Brinks, Hofer, Gilson & Lione; Jason C. White

(57) ABSTRACT

A method for determining an optimized set of polishing parameters is disclosed. a wafer is polished using one set of polishing parameters, and a first polishing result can then be determined. The wafer is then polished using a second set of polishing parameters, wherein at least one of the first polishing parameters has been changed, and a second polishing result can be determined. The first and second polishing results can then be analyzed to determine an optimized set of polishing parameters. A second wafer can then be polishing using the optimized set of polishing parameters.

20 Claims, 2 Drawing Sheets

US 6,315,634 B1

METHOD OF OPTIMIZING CHEMICAL MECHANICAL PLANARIZATION PROCESS

FIELD OF THE INVENTION

The present invention relates to chemical mechanical planarization applications. More particularly, the present invention relates to a method of optimizing the chemical mechanical planarization of semiconductor wafers.

BACKGROUND

Semiconductor wafers are typically fabricated with multiple copies of a desired integrated circuit design that will later be separated and made into individual integrated circuit chips. A common technique for forming the circuitry on a semiconductor is photolithography. Part of the photolithography process requires that a special camera focus on the wafer to project an image of the circuit on the wafer. The ability of the camera to focus on the surface of the wafer is often adversely affected by inconsistencies or unevenness in the wafer surface. The need for a precise image projection is accentuated with the current drive toward smaller, more complex integrated circuit designs. Semiconductor wafers are also commonly constructed in layers, where a portion of a circuit is etched on a first level and conductive vias are made to connect up to the next level of the circuit. After each layer of the circuit is etched on the wafer, an oxide layer is put down that allows the vias to pass through the oxide layer while covering the rest of the previous circuit level. Each layer of the circuit can create or add unevenness to the wafer as it is constructed. These imperfections are preferably smoothed out before generating the next circuit layer.

Chemical mechanical planarization (CMP) techniques are used to planarize the raw wafer and each layer of material added thereafter. Available CMP systems, commonly called wafer polishers, often use a rotating wafer holder that brings the wafer into contact with a polishing pad that is moving in the plane of the wafer surface to be planarized. When the polishing pad contacts the wafer surface, material is removed from the wafer thereby polishing the surface. In general, the three primary objectives of the CMP system are: (1) to planarize the surface of the wafer by removing portions of material that extend above the surface of the wafer; (2) to uniformly remove material from the entire surface of the wafer; and (3) polish the surface of the wafer to remove scratches or other defects.

The polishing pads commonly used in this process include both belt-type pads and rotary-type pads. A belt-type pad typically consists of one or more sections of material that are joined together to form a belt. The belt is placed around a plurality of rollers that cause the belt to rotate in a linear path. The rotating belt can then be brought into contact with the wafer to polish its surface. A rotary-type pad typically consists of one or more sections of material that are joined together to form a pad. The pad is attached to a rotary machine that rotates the pad to polish the surface of the wafer. A polishing fluid, such as a chemical polishing agent or slurry containing micro abrasives, can be used in conjunction with the polishing pad. The slurry is disposed between the polishing pad and the wafer and enhances the polishing of the wafer.

In polishing a wafer, the type of pad used, the slurry used, and other polishing parameters can be changed to produce different polishing results. For example, the hardness, stiffness, and construction of the polishing pad can be changed to effect the polishing. Also, the slurry used to polish the wafer, the polishing time, and the polishing pressure can also be varied.

The makeup of the wafer that is to be polished often dictates how the polishing parameters are selected. Different wafers and different layers within a wafer can have different compositions such as different materials, different patterns, and different pattern densities. Each of these different compositions can affect the polishing of the wafer and a specific combination of polishing parameters may be preferred for polishing a wafer that has a certain composition. Thus, selecting a combination of polishing parameters that will produce a desired result is important. However, current systems do not allow for an efficient and effect method of determining an optimum set of polishing parameters to achieve a desired polishing result. A method and system that overcomes these deficiencies is needed.

SUMMARY

According to one aspect of the invention, a wafer is polished using one set of polishing parameters, and a first polishing result can then be determined. The wafer is then polished using a second set of polishing parameters, wherein at least one of the first polishing parameters has been changed, and a second polishing result can be determined. The first and second polishing results can then be analyzed to determine an optimized set of polishing parameters. A second wafer can then be polishing using the optimized set of polishing parameters.

DETAILED DESCRIPTION OF THE PRESENTLY PREFERRED EMBODIMENTS

Figure 1:
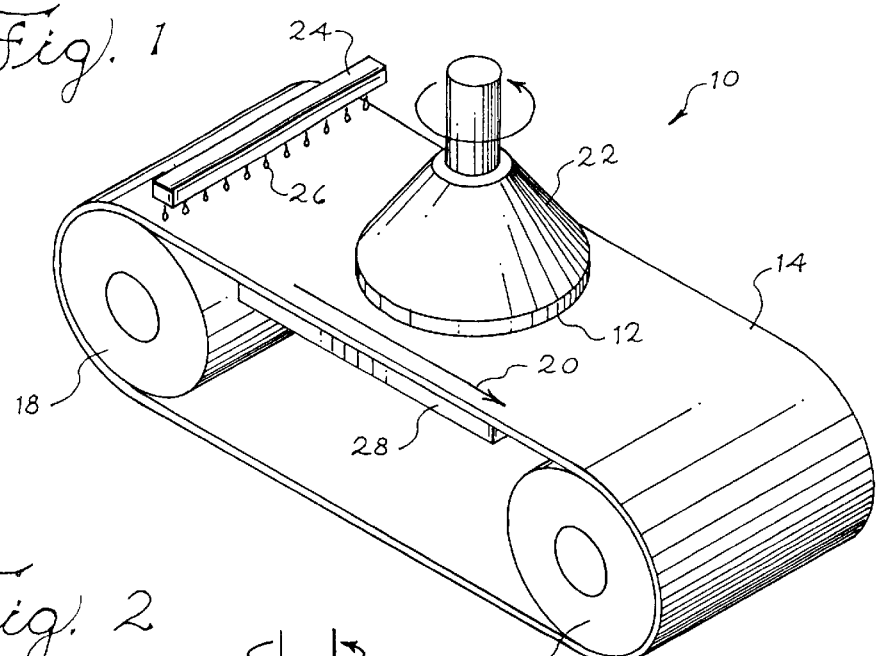
FIG. 1 is a perspective view of a system for polishing a wafer of a first preferred embodiment.
Figure 2:
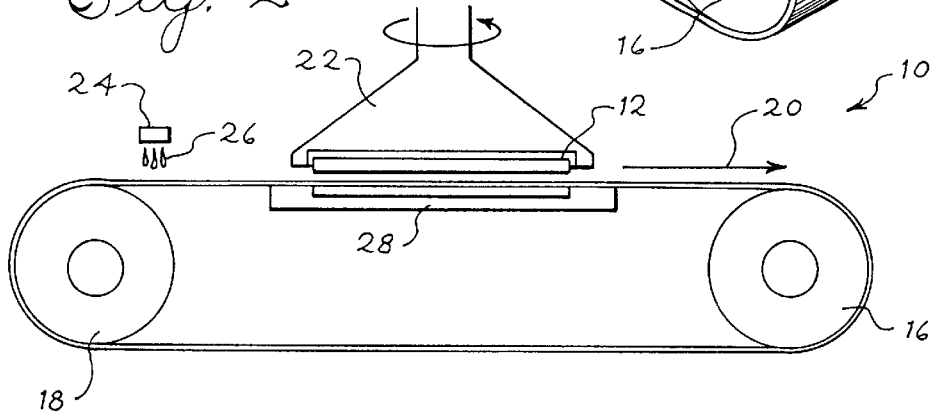
FIG. 2 is side view of the system of FIG. 1.

Referring now to FIGS. 1 and 2, a belt-type polisher 10 for use in the present invention is shown. One example of a suitable belt-type polisher is the TERES$^{TM}$ polisher available from Lam Research Corporation of Freemont, California. The belt-type polisher 10 is utilized to polish a semiconductor wafer 12 to remove materials from the surface of the wafer. The belt-type polisher 10 comprises a polishing pad 14 which moves in a linear direction 20 with respect to the surface of the wafer 12. The polishing pad 14 is a continuous belt rotating about rollers or spindles 16, 18, which are driven by a motor that causes the rollers to rotate. The wafer 12 can be supported by a wafer carrier 22 and is positioned so that the surface of the wafer comes into contact with the surface of the polishing pad 14. The movement of the polishing pad 14 removes material from the surface of the wafer 12. The material being removed from the surface of the wafer 12 can be the substrate material of the wafer itself or one of the layers formed on the substrate. Such formed layers include dielectric materials such as silicon dioxide, metals such as aluminum, copper or tungsten, metal alloys or semiconductor material such as silicon or polisilicon.

A slurry dispenser 24, can be used to dispense a slurry 26 onto the polishing pad 14. The slurry 26 is disposed between the wafer 12 and the polishing pad 14 and enhances the polishing of the wafer 12. A platen 28 can also be used to support the underside of the polishing pad 14. A primary purpose of the platen 28 is to provide a supporting platform on the underside of the polishing pad 14 to produce pressure that holds the polishing pad 14 against the wafer 12. Typically, the wafer carrier 22 is pressed downward against the polishing pad 14 with a force. Since the polishing pad 14 is flexible and will depress when the wafer 12 is pressed downward onto the polishing pad 14, the platen 28 provides a counteracting force to this downward force. Although the platen 28 can be a solid platform, a fluid type platen can also be used. One example of such a platen is described in U.S. Pat. No. 5,558,568, which is incorporated by reference.

The wafer 12 preferably comprises a portion of semiconductor material. The wafer 12 can comprise a blanket wafer, which has no pattern formed therein. Alternatively, the wafer 12 can comprise a pattern wafer that has one or more patterns of circuits formed within the wafer 12. In a pattern wafer, the circuits can be evenly or unevenly distributed throughout the wafer. Thus, the number of circuits present within a given section of the wafer, commonly known as the pattern density, can vary. As discussed below, the number of circuits present in the wafer 12 and the pattern density of the wafer 12 can affect the polishing of the wafer 12.

Figure 3:
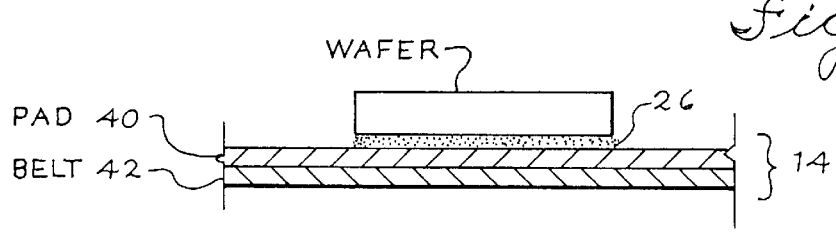
FIG. 3 is side view of a section of a polishing pad of a first preferred embodiment.
Figure 4:
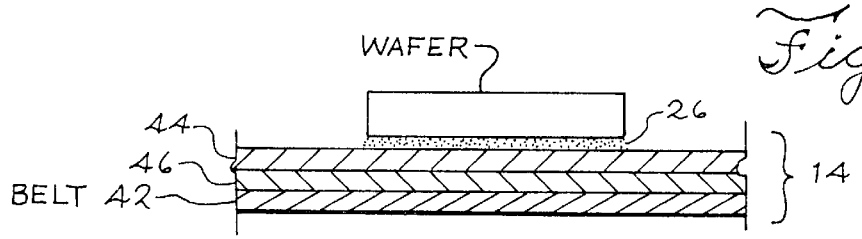
FIG. 4 is side view of a section of a polishing pad of a second preferred embodiment.

The polishing pad 14 can comprise different constructions, different hardnesses, and different stiffnesses. For example, the polishing pad 14 is preferably constructed from a polyurethane based polishing material 40, such as closed cell polyurethane, that is formed in a linear belt around a steel belt 42, as shown in FIG. 3. One suitable closed cell polyurethane material is IC 1000, which is available from Rodel. Alternatively, the polishing pad 14 can be constructed from a plurality of layers of material 44, 46, such as closed cell polyurethane over spongy or felt-like polyurethane, formed around a steel belt 42, as shown in FIG. 4. One suitable felt-like polyurethane material is the 817 pad available from Thomas West. A polishing pad that includes both a closed cell polyurethane and a spongy or felt-like polyurethane material is commonly referred as a stacked pad.

The hardness and stiffness of the polishing pad 14 can also vary. The material from which the polishing pad 14 is constructed often affects the hardness and the stiffness of the polishing pad 14. For example, a polishing pad constructed from a single material, such as the one shown in FIG. 3, tends to be harder and stiffer than a polishing pad constructed from a plurality of materials, such as the one shown if FIG. 4. While the hardness and the stiffness of the pad can be related, they can vary independently from one another. Also, the groove pattern formed in the pad can be altered. The number of grooves, width of grooves, space between grooves, and orientation of grooves can all be altered.

The slurry 26 comprises a mixture of liquid and solid material that is used in conjunction with the polishing pad 14 to affect the polishing of the wafer 12. The solid material can vary both in type and amount present in the slurry 26. In addition, the chemical makeup of the slurry 26 can also vary based on the chemical content of the liquid and/or the chemical content of the solid material. For example the ionization and the pH of the slurry 26 can vary depending upon the chemical content of the liquid and/or the solid material.

Changes in these, as well as other, polishing parameters can affect the polishing of the wafer 12. For example, changes in these parameters can affect the planarization of the wafer surface, the uniformity of the removal of material from the wafer surface, and the presence of defects on the wafer surface. For example, a polishing pad 14 constructed from a single material, such as the one shown in FIG. 3, will have a longer planarization length than the polishing pad shown in FIG. 4, because it is harder and stiffer. The planarization length is the radius of the region surrounding an elevated portion of the surface that is not polished because the polishing pad does not contact the unpolished area. Because the planarization length is longer the polishing pad 14 doesn't conform to different regions within a wafer 14, even if the pattern densities vary. Thus, this polishing pad evenly planarizes different parts of the wafer to produce an even wafer surface. Thus, the polishing pad shown if FIG. 3, can be preferred over the polishing pad shown in FIG. 4 for polishing wafers that have varying pattern densities.

Conversely, the stacked pad shown in FIG. 4 is effectively softer so that when pressure is applied to a local area of the polishing pad, the surrounding area is deformed. This makes the planarization length shorter for this polishing pad as compared to that of the polishing pad in FIG. 3. Because the stacked pad conforms to the surface of the wafer more readily than the polishing pad in FIG. 3., the stacked pad removes material from the surface of the wafer more uniformly than the polishing pad in FIG. 3. Thus, the stacked pad can be preferred for polishing wafers that have a consistent pattern density, but may not preferred for wafers with a low pattern density or varied pattern density.

The makeup of the slurry 26 can affect the polishing of the wafer. In general, the greater the amount of solid material present in the slurry 26 results in a greater planarization efficiency. However, in increase in the amount of solid material present in the slurry 26 can have negative effects such as scratching of the wafer surface. Thus, the more liquid present in the slurry 26, the better the polishing of the surface of the wafer without any results scratches or other defects.

The amount of time that the polishing pad 14 is in contact with the wafer 12, the polishing time, also affects the polishing of the wafer 12. In general, the longer the wafer 12 is in contact with the polishing pad 14, the greater the amount of polishing that will occur, assuming all other parameters remain constant. Also, the pressure at which the polishing pad 14 contacts the wafer 12, the polishing pressure, can also affect polishing. In general, the greater the polishing pressure, the greater the polishing.

Generally, the ultimate goal of polishing a wafer 12 is to produce a wafer that meets certain tolerances set by a manufacturer. To achieve such a desired polishing result, the use of a combination of polishing parameters may be necessary. For example, to effectively: (a) planarize a wafer 12; (b) uniformly remove material from the entire surface of the wafer 12; and (c) remove any defects, may require the use of a plurality of polishing pads. A hard/stiff pad, such as the one shown in FIG. 3, can be used for a period of time to planarize the surface of the wafer. A soft pad, such as the one shown in FIG. 4, can be used to uniformly remove additional material from the surface of the wafer while also removing any defects. However, the exact combination of polishing parameters needed to attain an ultimate polishing result must be determined.

Figure 5:
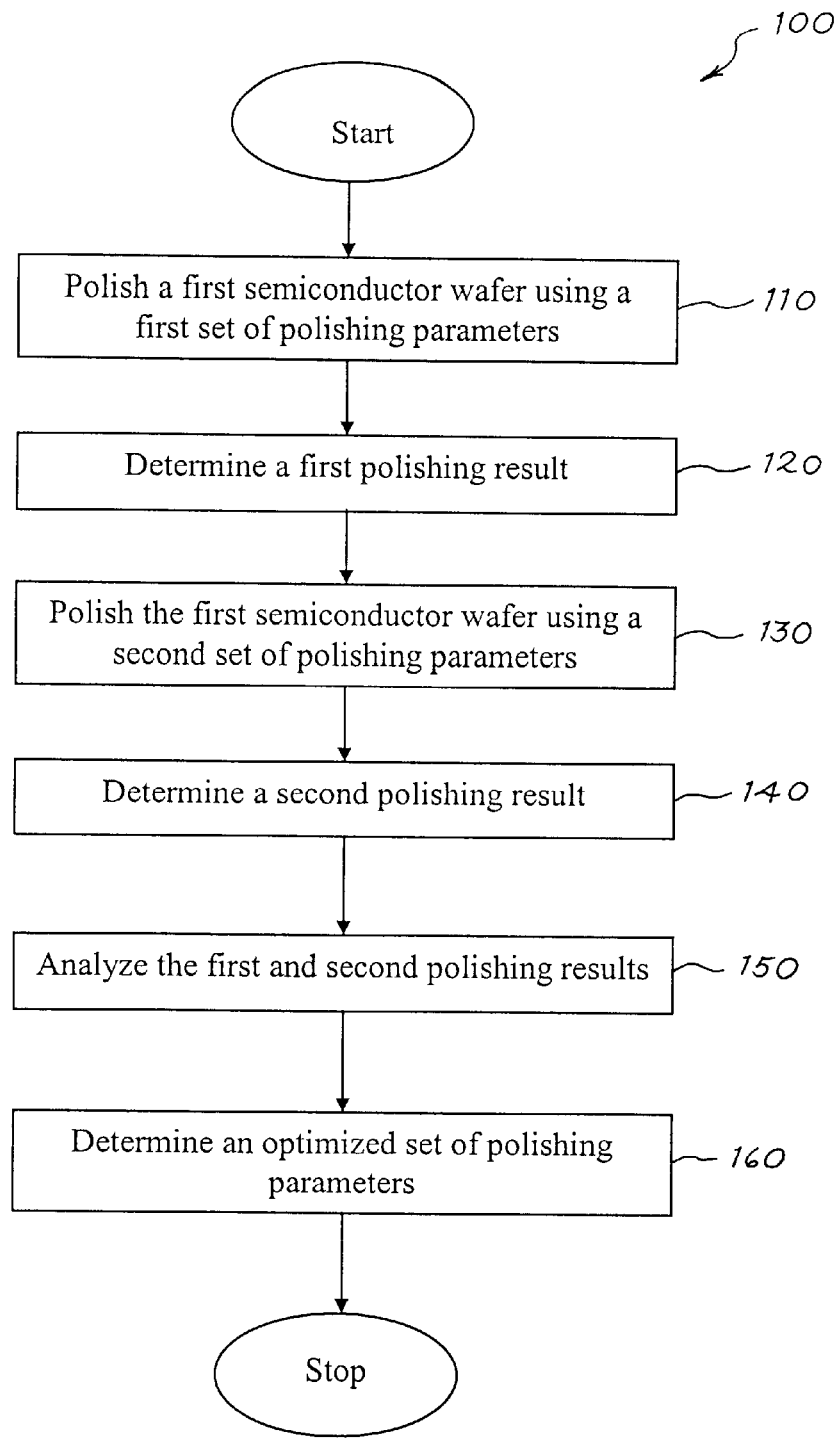
FIG. 5 is a flow chart of a method of optimizing a polishing process of a first preferred embodiment.

Referring now to FIG. 5, a method 100 of determining and optimized set of polishing parameters is shown necessary to achieve an ultimate polishing result is shown. The wafer 12 is polished for a first time using a first set of polishing parameters (act 110). For example, the wafer can be polished using the following polishing parameters: (a) a polishing pad, such as the one shown in FIG. 3, can be used; (b) a specific slurry can be used; (c) the polishing can last for a certain amount of time; and (d) a certain polishing pressure can be used. After the first polishing is completed, the wafer 12 can be examined to determine a first polishing result (act 120). For example, the removal rate, uniformity of polishing, planarization, and presence of defects can be determined by examining or measuring the wafer.

The wafer 12 can then be polished using a second set pf polishing parameters (act 130). The second set of polishing parameters preferably comprises the same set of parameters used in act 120, with at least one of them being changed. For example, the wafer 12 can be polished using a polishing pad such as the one shown in FIG. 4, while all the other polishing parameters remain unchanged. After the second polishing is completed, the wafer 12 can be examined to determine a second polishing result (act 140). For example, the removal rate, uniformity of polishing, planarization, and presence of defects can be determined by examining or measuring the wafer.

The first and second polishing results can then be analyzed (act 150) to determine an optimized set of polishing parameters (act 160). Thus, in accordance with the above example involving two different polishing pads, the amount of time that each of the polishing pads should be used to achieve a desired result can be determined. A second wafer can then be polished using the optimized set of polishing parameters (act 170).

The analysis and determination in acts 150 and 160 can be done in a number of ways. For example, the first and second polishing results can be plotted on a graph where the removal of material, or other measure of polishing result, is opposed by the hardness, or other characteristics, of the polishing pad. An optimized polishing parameters can then be determined by analyzing the graph. Also, a linear approximation can be done to determine optimized polishing parameters. In an alternative embodiment, the determination can be done using a personal computer running a program written in Excel by Microsoft Corporation or another suitable program. The polishing results can be input into the program, which can determine an optimized set of polishing results.

For example, a wafer can be polished using two different pads and removal rate profiles or uniformity profiles can be developed for each pad. The removal rate profile preferably represents how much material has been removed from each of several points that lie between the center and the edge of the wafer. The standard deviation of each of the removal rates that are used to generate the profile can also be determined. Assuming that the desired result in this example is to polish a wafer such that the removal rate varies as little as possible between the center and the edge, a weighted value can be calculated and assigned to each of the two pads that signifies that percentage or amount of time that each pad will be used in the polishing process. The total of the weighted values is preferably equal to 100. The weighted values can be determined by using a spreadsheet, such as Excel, to analyze the standard deviation data, which can be input into the spreadsheet, to produce a wafer having the desired surface characteristics.

In an alternative embodiment to the method depicted in FIG. 5, more than one of the first set of polishing parameters can be changed in the second set of polishing parameters. For example, the type of pad used and the slurry used in the first and second polishings can be changed. In addition, other combinations of polishing parameters can be changed in the first and second sets of polishing parameters.

In a further alternative embodiment, more than two different tests can be run on a wafer to determine an optimized set of polishing results. In a further alternative embodiment, a polisher including a rotary-type polishing pad can be used in place of the polishing pad shown in FIGS. 1–4.

It is to be understood that a wide range of changes and modifications to the embodiments described above will be apparent to those skilled in the art and are contemplated. It is therefore intended that the foregoing detailed description be regarded as illustrative rather than limiting, and that it be understood that it is the following claims, including all equivalents, that are intended to define the spirit and scope of the invention.

We claim:

1. A method of optimizing a chemical mechanical planarization process, the method comprising:

(a) polishing a surface of a first semiconductor wafer using a first polishing pad having a first hardness;

(b) determining a first polishing result in response to (a);

(c) polishing the surface of the first semiconductor wafer using a second polishing pad having a second hardness;

(d) determining a second polishing result in response to (c);

(e) determining an optimized usage of both the first and second polishing pads in response to the first and second polishing results; and (f) polishing a second semiconductor wafer in accordance with the optimized usages of both the first and second polishing pads.

2. The invention of claim 1, wherein (b) and (d) comprise determining a rate at which material is removed from the surface of the first semiconductor wafer.

3. The invention of claim 1, wherein (b) and (d) comprise determining the extent to which material is uniformly removed from the surface of the first semiconductor wafer.

4. The invention of claim 1, wherein (b) and (d) comprise determining the extent to which the surface of the first semiconductor is planarized.

5. The invention of claim 1, wherein (b) and (d) comprise determining the extent to which any defects are present on the surface of the first semiconductor wafer.

6. The invention of claim 1, wherein (e) comprises a graphical analysis.

7. The invention of claim 1, wherein (e) comprises a computer analysis.

8. The invention of claim 1, wherein (e) comprises a linear approximation analysis.

9. The invention of claim 1, wherein (e) comprises a model generation analysis.

10. The invention of claim 1, wherein (e) comprises comparing a specified tolerance with the first and second sets of polishing results.

11. A method of optimizing a chemical mechanical planarization process, the method comprising:

(a) polishing a surface of a first semiconductor wafer using a first polishing pad having a first construction;

(b) determining a first polishing result in response to (a);

(c) polishing the surface of the first semiconductor wafer using a second polishing pad having a second construction;

(d) determining a second polishing result in response to (c);

(e) determining an optimized usage of both the first and second polishing pads in response to the first and second polishing results; and (f) polishing a second semiconductor wafer using the optimized usage of both the first and second polishing pads.

12. The invention of claim 11, wherein (b) and (d) comprise determining a rate at which material is removed from the surface of the first semiconductor wafer.

13. The invention of claim 11, wherein (b) and (d) comprise determining the extent to which material is uniformly removed from the surface of the first semiconductor wafer.

14. The invention of claim 11, wherein (b) and (d) comprise determining the extent to which the surface of the first semiconductor is planarized.

15. The invention of claim 11, wherein (b) and (d) comprise determining the extent to which any defects are present on the surface of the first semiconductor wafer.

16. The invention of claim 11, wherein (e) comprises a graphical analysis.

17. The invention of claim 11, wherein (e) comprises a computer analysis.

18. The invention of claim 11, wherein (e) comprises a linear approximation analysis.

19. The invention of claim 11, wherein (e) comprises a model generation analysis.

20. The invention of claim 11, wherein (e) comprises comparing a specified tolerance with the first and second sets of polishing results.

* * * * *

UNITED STATES PATENT AND TRADEMARK OFFICE
CERTIFICATE OF CORRECTION

PATENT NO. : 6,315,634 B1
DATED : November 13, 2001
INVENTOR(S) : Alan J. Jensen et al.

It is certified that error appears in the above-identified patent and that said Letters Patent is hereby corrected as shown below:

<u>Title page,</u>
ABSTRACT,
Line 2, delete "disclosed. a" and substitute -- disclosed.  A -- in its place.
Lines 9-10, delete "polishing using" and substitute -- polished using -- in its place.

<u>Column 6,</u>
Line 50, delete "8. The" and substitute -- 8.  The -- (there should be two spaces between "8." and "The").

Signed and Sealed this

Twenty-ninth Day of October, 2002

Attest:

Attesting Officer

JAMES E. ROGAN
*Director of the United States Patent and Trademark Office*